(12) United States Patent
Lin et al.

(10) Patent No.: US 11,903,245 B2
(45) Date of Patent: Feb. 13, 2024

(54) DISPLAY PANEL ADDING A BLOCKING MEMBER PREVENTING VISIBILITY OF A MARK, MANUFACTURING METHOD OF THE DISPLAY PANEL, AND DISPLAY DEVICE

(71) Applicants: Beihai HKC Optoelectronics Technology Co., Ltd., Beihai (CN); HKC Corporation Limited, Shenzhen (CN)

(72) Inventors: Peixin Lin, Beihai (CN); Haijiang Yuan, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 257 days.

(21) Appl. No.: 17/337,452

(22) Filed: Jun. 3, 2021

(65) Prior Publication Data
US 2022/0037627 A1   Feb. 3, 2022

(30) Foreign Application Priority Data
Jul. 31, 2020 (CN) .......................... 202010756639.8

(51) Int. Cl.
*H10K 50/86* (2023.01)
*H10K 59/38* (2023.01)
*H10K 71/00* (2023.01)

(52) U.S. Cl.
CPC .......... *H10K 50/865* (2023.02); *H10K 59/38* (2023.02); *H10K 71/00* (2023.02)

(58) Field of Classification Search
CPC ....... H10K 50/865; H10K 59/38; H10K 71/00
See application file for complete search history.

(56) References Cited

U.S. PATENT DOCUMENTS

2015/0179586 A1\* 6/2015 Youk ................. G02F 1/133512
427/58
2022/0093692 A1\* 3/2022 Li ......................... G06F 1/1601

FOREIGN PATENT DOCUMENTS

| CN | 108132554 A | 6/2018 |
| CN | 111199881 A | 5/2020 |
| CN | 111399275 A | 7/2020 |

\* cited by examiner

*Primary Examiner* — Nduka E Ojeh

(57) ABSTRACT

The application discloses a display panel, a manufacturing method of the display panel, and a display device. The display panel includes a display area and a non-display area, and includes a first substrate and a second substrate that is aligned and bonded with the first substrate. The first substrate includes a mark corresponding to the non-display area. The second substrate includes a light shielding portion corresponding to the mark, and the light shielding portion includes a blocking member corresponding to the mark.

13 Claims, 4 Drawing Sheets

DISPLAY PANEL ADDING A BLOCKING MEMBER PREVENTING VISIBILITY OF A MARK, MANUFACTURING METHOD OF THE DISPLAY PANEL, AND DISPLAY DEVICE

The present application claims priority to the Chinese Patent Application No. 202010756639.8, filed Jul. 31, 2020, which is hereby incorporated by reference herein as if set forth in its entirety.

TECHNICAL FIELD

This application relates to the field of display technology, and more particularly relates to a display panel, a manufacturing method of the display panel, and a display device.

BACKGROUND

The statements herein merely provide background information related to the present application but don't necessarily constitute the prior art.

Display devices have become mainstream display products by virtue of their thin body, power saving, low radiation, etc.. and are widely used in the market. A display device includes a display panel and a backlight module. The display panel includes a first substrate and a second substrate. The first substrate sequentially includes a first base, a first metal layer, an insulating layer, a semiconductor layer, a second metal layer, a passivation layer, a pixel electrode layer, and a mark. The second substrate sequentially includes a second base, a light shielding portion, and a common electrode layer.

The mark is typically used for purposes of facilitating alignment in the manufacture procedures of the various layers of the first substrate. However, although the mark may be blocked by the light shielding portion after the display panel cell is fabricated, it may still be seen by the user, thus affecting the user experience.

SUMMARY

It is therefore an objective of this application to provide a display panel, a manufacturing method of the display panel, and a display device, which can prevent the user from observing the mark thus improving the user experience.

The present application discloses a display panel. The display panel includes a display area and a non-display area. The display panel includes a first substrate and a second substrate disposed opposite to the first substrate. The first substrate includes a mark corresponding to the non-display area. The second substrate includes a light shielding portion corresponding to the non-display area, and the light shielding portion includes a blocking member corresponding to the mark.

This application further discloses a manufacturing method of a display panel, including:
forming a mark in a non-display area of a first substrate;
forming a light shielding portion in a non-display area of a second substrate; and
forming a blocking member on the light shielding portion at a position corresponding to a position where the mark is formed.

The present application further discloses a display device that includes a display panel. The display panel includes a display area and a non-display area, and includes a first substrate and a second substrate disposed opposite to the first substrate. The first substrate includes a mark corresponding to the non-display area. The second substrate includes a light shielding portion corresponding to the non-display area, and the light shielding portion includes a blocking member corresponding to the mark.

Although the mark is blocked by the light-shielding portion, the effect of blocking the mark by the light shielding portion is not satisfactory. In this application, in addition to the light shielding portion provided in the non-display area of the second substrate, a blocking member is additionally provided at a position corresponding to the mark. Thus, the joint shielding of the light shielding portion and the blocking member realizes more adequate shielding of the mark, ensuring that it is not observed by the user which may otherwise affect the user experience.

BRIEF DESCRIPTION OF DRAWINGS

The drawings included herein are intended to provide a further understanding of the embodiments of the present application. They constitute a part of the specification, and are used to illustrate the embodiments of the present application, and explain the principle of the present application in conjunction with the specification. Apparently, the drawings in the following description merely represent some embodiments of the present disclosure, and for those having ordinary skill in the art, other drawings may also be obtained based on these drawings without investing creative efforts. In the drawings.

DETAILED DESCRIPTION OF EMBODIMENTS

Figure 1:
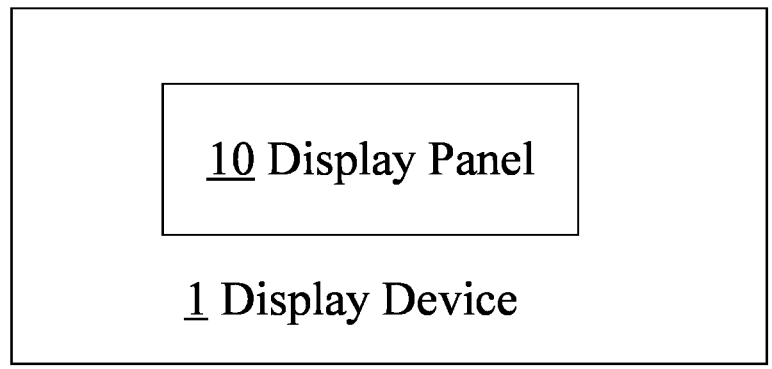
FIG. 1 is a schematic diagram of a display device according to an embodiment of the present application.

It will be appreciated that the terminology used, and the specific structure and function details disclosed herein are intended for mere purposes of illustrating specific embodiments and are representative. This application, however, maybe implemented in many alternative forms and thus is not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple" or "a plurality of" means two or more. Terms "including", "comprising", and any variations thereof are intended for non-exclusive inclusion, meaning that there may exist or may be added one or more other features, integers, steps, operations, units, components, and/or combinations thereof.

In addition, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms should not be construed as restricting the present disclosure.

Furthermore, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application can be understood on a case-by-case basis.

A display device includes a display panel and a backlight module. The display panel includes a first substrate and a second substrate. The first substrate sequentially includes a first base, a first metal layer. an insulating layer, a semiconductor layer, a second metal layer, a passivation layer, a pixel electrode layer, and a mark. The second substrate sequentially includes a second base, a light shielding portion, and a common electrode layer. The mark is typically used for purposes of facilitating alignment in the manufacture procedure of the various layers of the first substrate. However, although the mark may be blocked by the light shielding portion after the display panel is fabricated, it may still be seen by the user, thus affecting the user experience.

Hereinafter, this application will be described in further detail in connection with the drawings and some optional embodiments.

Figure 2:
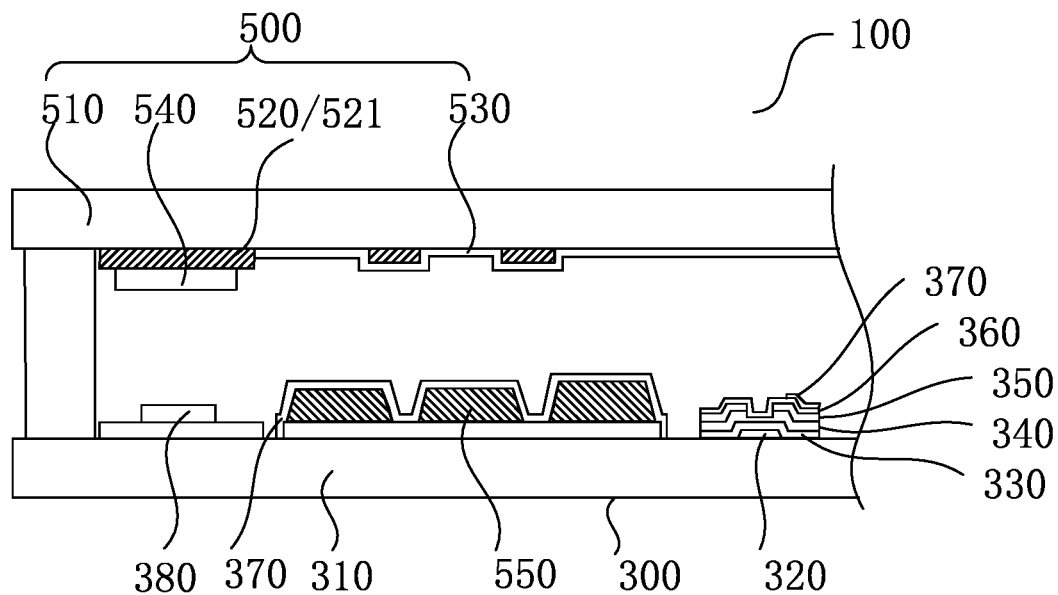
FIG. 2 is a schematic diagram of a display panel according to an embodiment of the present application.

As an embodiment of the present application, a display device is disclosed in the schematic diagram of the display device in FIG. 1. The display device 1 includes a display panel 10. In particular, as illustrated in the schematic diagram of the display panel shown in FIG. 2, the display panel 10 includes a display area 100 and a non-display area 200. The display panel 10 includes a first substrate 300 and a second substrate 500 that is disposed opposite to the first substrate 300. The first substrate 300 includes a mark 380 corresponding to the non-display area. The second substrate 500 includes a light shielding portion 521 corresponding to the non-display area 200, and the light shielding portion 521 includes a blocking member 540 corresponding to the mark 380.

The first substrate 300 may be an array substrate, and the second substrate 500 may be a color filter substrate. Of course, the first substrate 300 and the second substrate 500 may also be other types of substrates, as long as they are applicable herein.

The mark 380 is typically used for facilitating the alignment in the manufacture procedure of various film layers on the first substrate 300. In the process of forming each film layer, the mark 380 is used as an identification alignment point for positioning and film formation purposes, so as to ensure that the film formation position does not deviate. In particular, the mark 380 may be formed in the same manufacture procedure as each of the film layers of the first substrate 300, or formed in the manufacture procedure as one film layer. For example, if the first substrate sequentially includes a first metal layer 320, an insulating layer 330, a semiconductor layer 340, a second metal layer 350, a passivation layer 360, and a pixel electrode layer 370, then each layer may be formed with a mark 380 for facilitating the alignment of the next manufacture procedure. By way of example, the mark 380 formed on the first metal layer 320 may be used for facilitating the alignment in the forming process of the insulating layer 330; the mark 380 formed on the insulating layer 330 may be used for facilitating the alignment in the forming process of the semiconductor layer 340; the mark 380 formed on the semiconductor layer 340 may be used for facilitating the alignment in the forming process of the second metal layer 350; the mark 380 formed on the second metal layer 350 may be used for facilitating the alignment in the forming process of the passivation layer 360; and the mark 380 formed on the passivation layer 360 may be used for facilitating the alignment in the formation process of the pixel electrode layer 370. In this solution, where each layer is formed with a mark 380 for facilitating the alignment of the next film layer, the alignment of each film layer can be more accurate. For another example, the mark 380 may be formed in the manufacture procedure of one or two layers selected from the first metal layer 320, the insulating layer 330, the semiconductor layer 340, the second metal layer 350, the passivation layer 360, and the pixel electrode layer 370. For example, the mark 380 may be formed in the process of forming the first metal layer 320, for facilitating the subsequent alignment in the formation of the next film layer. In another example, the mark 380 is formed in the process of forming the passivation layer 360 for facilitating the subsequent alignment in the film formation of the pixel electrode layer. Therefore, the film layers on which the mark 380 is formed can be selected according to actual production needs.

The mark 380 is typically arranged in the non-display area 200. After the display panel cell is fabricated, the light-shielding portion 521 provided on the non-display area 200 on the second substrate 500 would shield the mark 380, where the light-shielding portion 521 is typically formed in the process of forming the light-shielding layer 520. However, the applicant has found that although the mark 380 is shielded by the light-shielding portion 521. the film layer of the light-shielding portion 521 in the display panel 10 is very thin, and the color of the material of the light-shielding portion 521 is not black enough. As a result, the light shielding portion 521 may be able to create an adequate light shielding effect for other traces due to their uniform arrangement, but may result in an unsatisfactory shielding effect for the mark because the mark is designed in a comparatively more independent manner and so is relatively more distinct from its surroundings. Thus, the mark may still have chances of being observed by users, affecting the user experience. Especially under the trend of development of narrow borders, the gate driver on array (GOA) 400 is directly formed on the non-display area 200 of the first substrate 300, so that the width of the light-shielding portion 521 is further reduced. In practice, the mark 380 is often relatively large, such that effect of shielding the mark 380 by the light shielding portion 521 may become even worse. In this application, in addition to the light shielding portion 521 provided in the non-display area 200 of the second substrate 500, a blocking member 540 is additionally provided at a position corresponding to the mark 380. Thus, the joint shielding of the light shielding portion 521 and the blocking member 540 may realize more adequate shielding of the mark 380, ensuring that it is not observed by the user thus improving the user experience.

The first substrate 300 sequentially includes a first substrate 310, a first metal layer 320, an insulating layer 330, a semiconductor layer 340, a second metal layer 350, a passivation layer 360, and a pixel electrode layer 370. The mark 380 may be formed on one or more selected from the group comprised of the first metal layer 320, the insulating layer 330, the semiconductor layer 340, the second metal layer 350, the passivation layer 360, and the pixel electrode layer 370. When the mark 380 is provided in multiple layers, the marks 380 in multiple layers are arranged on the first substrate 300 corresponding to the non-display area.

The second substrate 500 sequentially includes a second base 510, a light shielding layer 520, a color filter layer 550, a blocking member 540, and a common electrode layer 530. The light-shielding portion 521 may be formed together in the process of forming the light-shielding layer 520, and the blocking member 540 may be formed together in the process of forming the color filter layer 550.

In this case, because the color filter layer 550 is disposed on the color filter substrate, forming the blocking member 540 together in the process of forming the color filter layer 550 can enhance the shielding effect without needing to add additional processes. As illustrated in the schematic diagram of the display panel shown in FIG. 3, the color filter layer 550 may also be disposed on the first substrate 300, that is, the structure of the display panel 10 is CF on array in this case, and the process of forming the color filter layer 550 can still be used, namely a process of forming a color filter layer 550 may be added to the manufacture procedure of the second substrate 500, so as to create the blocking member 540.

The color filter layer 550 may further include a red color filter 551, a green color filter 552, and a blue color filter 553, and the blocking member 540 may be formed in the same process as the blue color filter 553. In practical applications, the blue color filter 553 may generally have a bigger thickness than that of the red color filter 551 and the green color filter 552. Thus, by forming the blocking member 540 and the blue color filter 553 in the same manufacture procedure, a good shielding effect would be available due to the relatively large thickness of the blue color filter 553.

In addition, the blocking member may also adopt a multilayer structure. Taking a double-layer structure as an example, referring to FIG. 3, the color filter layer 550 includes a red color filter 551, a green color filter 552, and a blue color filter 553, and the blocking member 540 includes at least a first blocking layer 541 and a second blocking layer 542 that are stacked one over another. The first blocking layer 541 is formed on the light shielding portion 521, and the second blocking layer 542 is formed on the side of the first blocking layer 541 adjacent to the display area. The first blocking layer 541 may be formed in the same manufacture process as one of the red color filter 551, the green color filter 552, or the blue color filter 553, and the second blocking layer 542 may be formed in the same manufacture process as one of the red color filter 551, the green color filter 552, or the blue color filter 553, where the first blocking layer 541 and the second blocking layer 542 may correspond to different colors. In particular, the first blocking layer 541 and the red color filter 551 are formed in the same manufacture process, and the second blocking layer 542 and the blue color filter 553 are formed in the same manufacture process.

As more and more narrow-border display panels 10 are emerging, the width of the light shielding portion 521 in the non-display area 200 is becoming even smaller, making the mark 380 even closer to the display area 100. Especially in cases where the mark 380 is made of metal materials such as the first metal layer 320 or the second metal layer 350, the closer the mark 380 is to the display area 100, the easier it is to be observed by the user due to light reflection or the inadequate shielding effect of the light shielding portion 521. By forming the second blocking layer 542 on the side of the first blocking layer 541 closer to the display area, the thickness of the blocking member 540 near the display area 100 is increased, thus well shielding the mark 380.

Alternatively, the blocking member 540 and the light shielding portion 521 are formed in the same manufacture process. The blocking member 540 may be disposed on the light shielding portion 521 and formed in the same manufacture process as the light shielding portion 521. The blocking member 540 may use the same material as the material of the light shielding portion 521, and they may be integrally formed during film formation. Thus, they are not prone to inadequate adhesion compared with the cases where they are made of different materials and are separately formed. Accordingly, the blocking member 540 is not prone to falling off from the light shielding portion 521. In addition, because the blocking member 540 and the light shielding portion 521 are formed in the same manufacture process, regardless of whether the color filter layer 550 is disposed on the first substrate 300 or the second substrate 500, no additional manufacture procedure is required and it is not affected by the disposition of the color filter layer 550.

The blocking member 540 may have a larger area than the mark 380, and the orthogonal projection of the blocking member 540 onto the first substrate 300 may completely cover the mark 380, It is thus ensured that in the case of a cell alignment error, the blocking member 540 can still completely cover the mark 380 after the display panel 10 has been fabricated as a cell.

Figure 3:
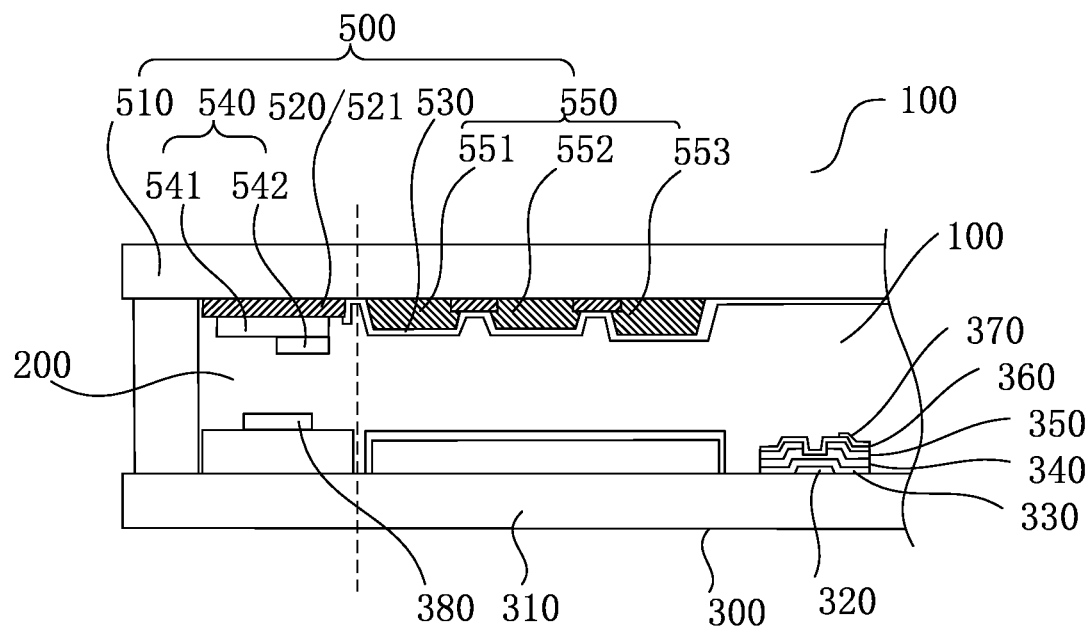
FIG. 3 is a schematic diagram of another display panel according to an embodiment of the present application.
Figure 4:
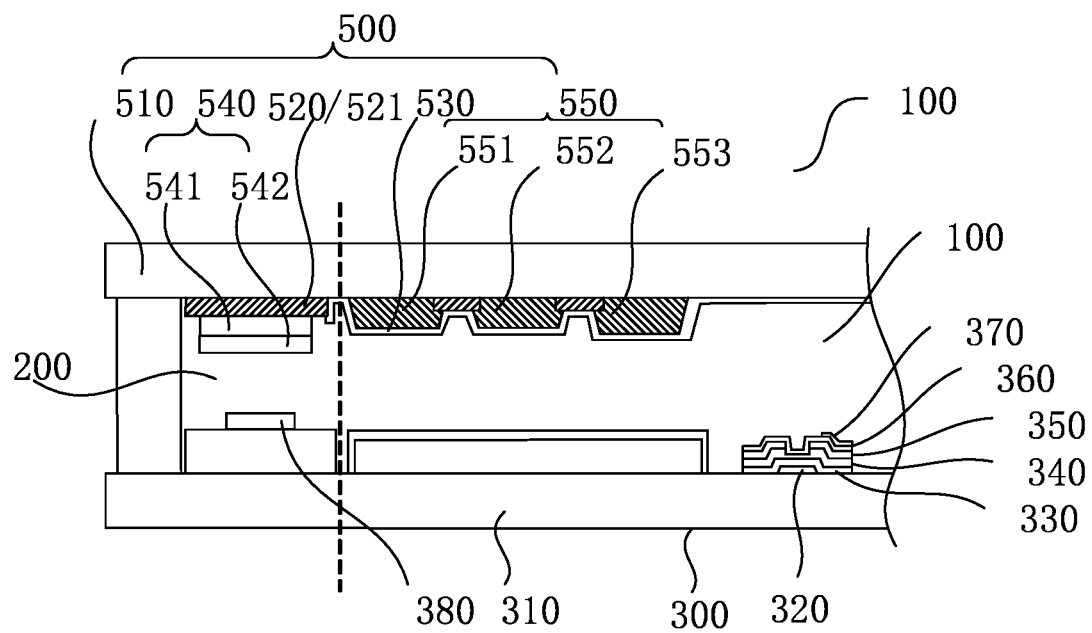
FIG. 4 is a schematic diagram of a display device with a double-layer structured blocking member.

FIG. 4 illustrates another alternative to the above embodiment, and it mainly differs from the embodiment illustrated in FIG. 3 in that the second blocking layer is formed on the first blocking layer and coincides with the first blocking layer. With the second blocking layer exactly coinciding with the first blocking layer, the shading effect can be improved in all directions thus further improving the display quality.

The mark 380 may be made of a metal material. In particular, it may be formed together in the process of forming the first metal layer 320 or the second metal layer 350, and so no additional process is required. By making the mark 380 of a metal material, the recognition accuracy of a film forming machine can be improved. Prior to the improvement proposed by the applicant, the mark 380 was made of metal material, which had the problem of light reflection. As a result, after the cell is formed, the mark 380 is more prone to be observed by the user. In this application, the blocking member 540 is added on the second substrate 500 corresponding to the mark 380. Thus, in cases where the mark 380 is made of a metal material, this not only improves the recognition accuracy of the film forming machine, but also facilitates the shielding of the mark 380, ensuring that it will not be observed by the user and affect the user experience. Of course, the mark 380 may also be made of a non-metallic material. In particular, it may be formed together in the process of forming the insulating layer 330, the semiconductor layer 340, or the passivation layer 360, and no additional process is required.

Figure 5:
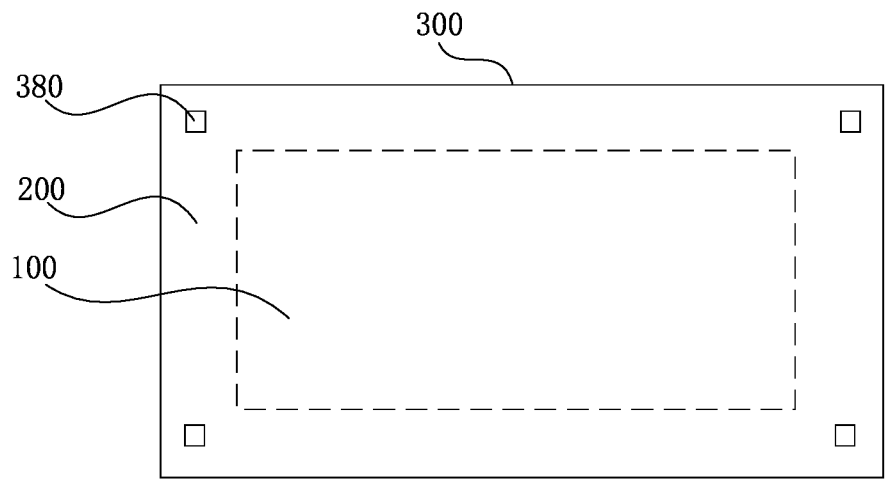
FIG. 5 is a schematic top view of a first substrate according to another embodiment of the present application.

As illustrated in the schematic diagram of the first substrate 300 as shown in FIG. 5, there are four marks 380, which are arranged at the four corners of the first substrate 300, and there are four blocking members, which are disposed at the four corners of the second substrate 500 corresponding to the four marks 380. By providing four marks 380, the alignment can be made more accurate. The four corners of the display panel are not easily observed by the user during normal use. By providing the marks 380 at these positions, in combination with the additional shielding of the blocking member, it can be made more difficult for the user to see the mark 380. In addition, the other spaces in the non-display area 200 generally need to be used for arranging various wirings, so arranging the marks 380 at the four corners will not occupy the wiring design space.

Figure 6:
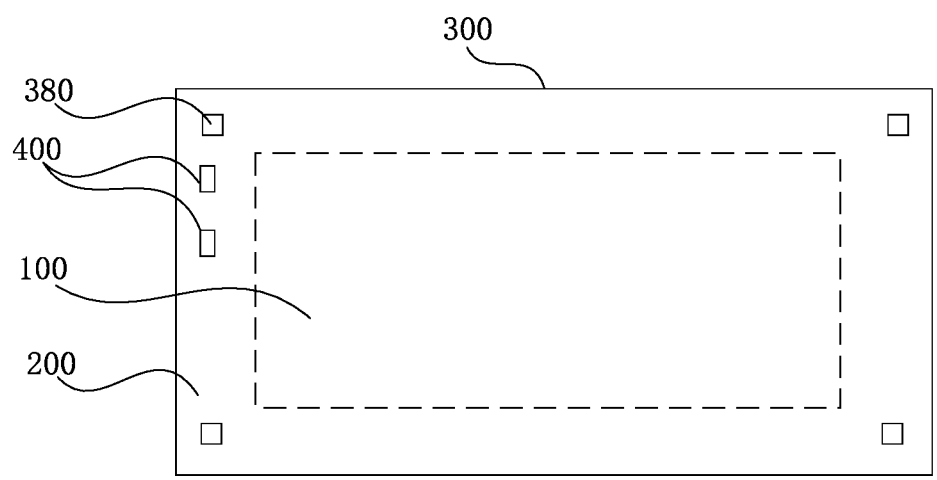
FIG. 6 is a schematic top view of a first substrate according to yet another embodiment of the present application.

Further, the first substrate 300 may also include an array substrate gate drive circuitry 400 (GOA, Gate Driver On Array), as illustrated in the schematic diagram shown in FIG. 6. In cases where the mark 380 is formed in the same process as the passivation layer 360, the position of the mark 380 is staggered from the array substrate gate drive circuitry 400. The GOA circuitry has a complex structure and has many wires. The recognition of the mark 380 may easily be interfered with if it is arranged on the GOA circuitry, thereby reducing the recognition accuracy of the mark 380.

Figure 7:
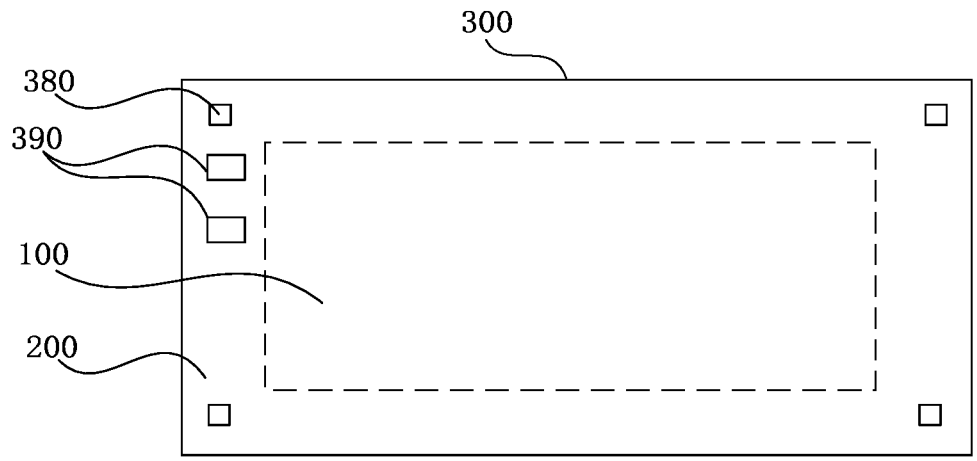
FIG. 7 is a schematic top view of a first substrate according to still another embodiment of the present application.

FIG. 7 shows a schematic diagram of a thin film transistor 390. In particular, the first substrate 300 may include a plurality of thin film transistors 390 corresponding to the non-display area, and the mark 380 may be formed on one or more of the insulating layer 330, the semiconductor layer 340, the second metal layer 350, the passivation layer 360, and the pixel electrode layer 370, where the positions of the marks 380 are staggered from the positions of the thin film transistors 390. The thin film transistor 390 is typically relatively thicker, hence a greater height, and so is closer to the second substrate 500. Thus, after the cell is fabricated, it may be more difficult for the user to notice the presence of the mark 380.

Figure 8:
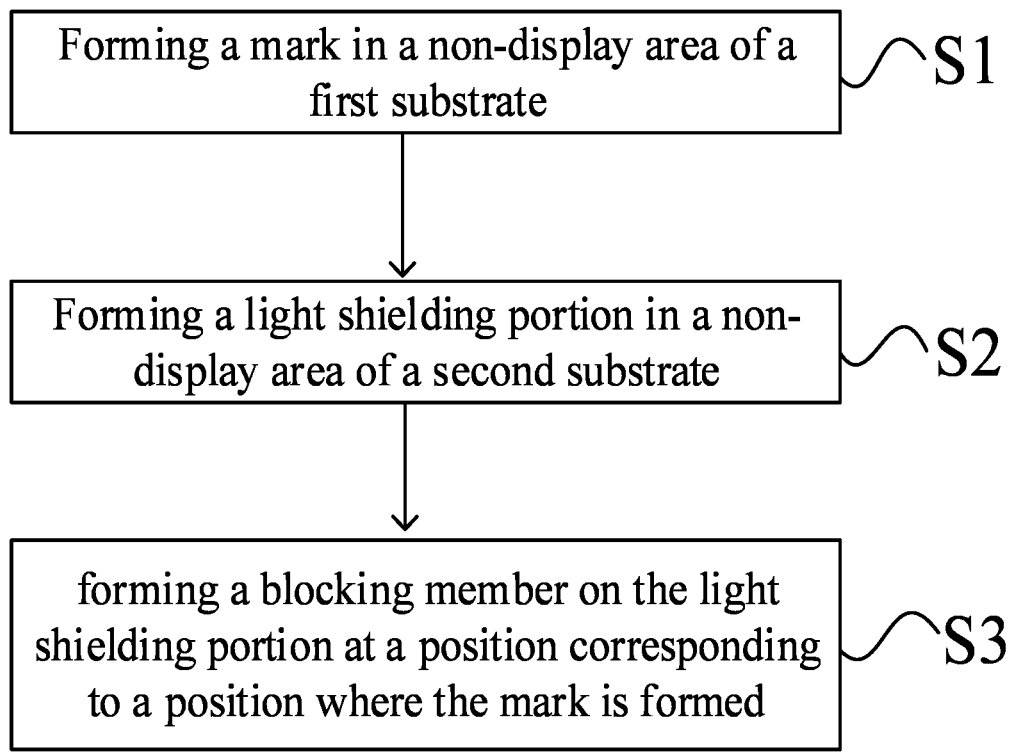
FIG. 8 is a schematic flowchart of a manufacturing method of a display panel according to still another embodiment of the present application.

As another embodiment of the present application, a manufacturing method of a display panel is further disclosed, and is applied to the above-mentioned display panel. The manufacturing method includes the following operations S1 to S3 as illustrated in FIG. 8.

S1: forming a mark in a non-display area of a first substrate;

S2: forming a light shielding portion in a non-display area of a second substrate;

S3: forming a blocking member on the light shielding portion at a position corresponding to a position where the mark is formed.

It should be noted that the various steps defined in this solution are not to be construed as limiting the order in which these steps are performed, on the premise of not affecting the implementation of the specific solution. In other words, the steps written earlier may be performed first, or may also be performed later, or may even be performed simultaneously. As long as the solution is able to be implemented, they variations shall all be regarded as falling in the scope of protection of this application.

The technical solutions of this application may be widely used in various display panels, such as TN (Twisted Nematic) display panels, IPS (In-Plane Switching) display panels, VA (Vertical Alignment) 1) Display panel, MVA (Multi-Domain Vertical Alignment) display panels. Of course, the above solutions may also be applicable to other types of display panels, such as OLED (Organic Light-Emitting Diode) display panels, The foregoing is merely a further detailed description of the present application in connection with some specific illustrative implementations, and it is to be construed as limiting the implementation of the present application to these implementations. For those having ordinary skill in the technical field to which this application pertains, numerous simple deductions or substitutions may be made without departing from the concept of this application, which shall all be regarded as falling in the scope of protection of this application.

What is claimed is:

1. A display panel, comprising a display area and a non-display area, the display panel comprising:
a first substrate; and
a second substrate, disposed opposite to the first substrate;
wherein the first substrate comprises a mark corresponding to the non-display area;
the second substrate comprises a light shielding portion corresponding to the non-display area, and the light shielding portion comprises a blocking member corresponding to the mark.
wherein the second substrate sequentially comprises a second base, a light shielding layer, a color filter layer, the blocking member, and a common electrode layer, wherein the light shielding portion and the light shielding layer are formed in a same manufacture process by using a same material;
wherein the blocking member and the color filter layer are formed in the same manufacture process by using a same material.

2. The display panel according to claim 1, wherein the color filter layer comprises a red color filter, a green color filter, and a blue color filter, wherein the blocking member and the blue color filter are formed in the same manufacture process.

3. The display panel according to claim 1, wherein the first substrate sequentially comprises a first base, a first metal layer, an insulating layer, a semiconductor layer, a second metal layer, a passivation layer, and a pixel electrode layer; wherein the mark is mounted in one or more selected from the group comprised of the first metal layer, the insulating layer, the semiconductor layer, the second metal layer, the passivation layer, and the pixel electrode layer; wherein when the mark is arranged in more than one layer, the marks arranged in these layers are arranged on the first substrate corresponding to the non-display area.

4. The display panel according to claim 3, wherein the mark is formed in the same manufacture process as the manufacture process of the first metal layer.

5. The display panel according to claim 3, wherein the mark is formed in the same manufacture process as the manufacture process of the second metal layer.

6. The display panel according to claim 3, wherein the first substrate comprises a plurality of thin film transistors corresponding to the non-display area, and the mark is formed in one or more selected from the group comprised of the insulating layer, the semiconductor layer, the second metal layer, the passivation layer, and the pixel electrode layer, and wherein the marks are arranged at positions that are staggered from the positions of the plurality of thin film transistors.

7. The display panel according to claim 1, wherein the blocking member has a larger area than that of the mark, and an orthogonal projection of the blocking member on the first substrate totally covers the mark.

8. The display panel according to claim 1, wherein a number of the marks is four, and the marks are respectively arranged at four corners of the first substrate, and a number of the block members is four too, wherein the block members are arranged at four corners of the second substrate, and one-to-one correspondence with the marks.

9. The display panel according to claim 1, wherein the first substrate comprises an array substrate gate drive circuitry, and the mark is arranged at a position that is staggered from the array substrate gate drive circuitry.

10. A manufacturing method of a display panel, comprising:
   forming a mark in a non-display area of a first substrate;
   forming a light shielding portion in a non-display area of a second substrate; and
   forming a blocking member on the light shielding portion at a position corresponding to a position where the mark is formed;
   wherein the second substrate is formed to sequentially comprise a second base, a light shielding layer, a color filter layer, the blocking member, and a common electrode layer, wherein the light shielding portion and the light shielding layer are formed in a same manufacture process by using a same material,
   wherein the blocking member and the color filter layer are formed in the same manufacture process by using a same material.

11. A display device, comprising a display panel that comprises a display area and a non-display area, the display panel comprising:
   a first substrate; and
   a second substrate, disposed opposite to the first substrate;
   wherein the first substrate comprises a mark corresponding to the non-display area;
   the second substrate comprises a light shielding portion corresponding to the non-display area, and the light shielding portion comprises a blocking member corresponding to the mark;
   wherein the second substrate sequentially comprises a second base, a light shielding layer, a color filter layer, the blocking member, and a common electrode layer, wherein the light shielding portion and the light shielding layer are formed in a same manufacture process by using a same material;
   wherein the blocking member and the color filter layer are formed in the same manufacture process by using a same material.

12. The display device according to claim 11, wherein the color filter layer comprises a red color filter, a green color filter, and a blue color filter, and the blocking member is formed in the same manufacture process as a manufacture process of the blue color filter.

13. The display device according to claim 11, wherein the color filter layer comprises a red color filter, a green color filter, and a blue color filter;
   the blocking member comprises at least a first blocking layer and a second blocking layer that are stacked one over another, wherein the second blocking layer is formed on a side of the first blocking layer adjacent to the display area;
   wherein the first blocking layer is formed in the same manufacture process as a manufacture process of the red color filter, and the second blocking layer is formed in the same manufacture process as a manufacture process of the blue color filter.

* * * * *